United States Patent
Ku

(10) Patent No.: US 11,295,788 B2
(45) Date of Patent: Apr. 5, 2022

(54) OFFSET CANCELLATION VOLTAGE LATCH SENSE AMPLIFIER FOR NON-VOLATILE MEMORY

(71) Applicant: eMemory Technology Inc., Hsinchu (TW)

(72) Inventor: Wei-Ming Ku, Zhubei (TW)

(73) Assignee: EMEMORY TECHNOLOGY INC., Hsinchu (TW)

(*) Notice: Subject to any disclaimer, the term of this patent is extended or adjusted under 35 U.S.C. 154(b) by 58 days.

(21) Appl. No.: 16/912,144

(22) Filed: Jun. 25, 2020

(65) Prior Publication Data

US 2021/0050039 A1 Feb. 18, 2021

Related U.S. Application Data

(60) Provisional application No. 62/886,286, filed on Aug. 13, 2019.

(51) Int. Cl.
| | |
|---|---|
| *G11C 7/06* | (2006.01) |
| *G11C 16/28* | (2006.01) |
| *G11C 7/12* | (2006.01) |
| *G11C 16/04* | (2006.01) |
| *G11C 16/10* | (2006.01) |
| *G11C 16/14* | (2006.01) |
| *G11C 16/26* | (2006.01) |
| *G11C 16/34* | (2006.01) |

(52) U.S. Cl.
CPC ............... *G11C 7/065* (2013.01); *G11C 7/12* (2013.01); *G11C 16/0433* (2013.01); *G11C 16/10* (2013.01); *G11C 16/14* (2013.01); *G11C 16/26* (2013.01); *G11C 16/28* (2013.01); *G11C 16/3436* (2013.01); *G11C 2216/04* (2013.01)

(58) Field of Classification Search
CPC ......... G11C 7/065; G11C 16/28; G11C 7/106; G11C 11/5642
USPC ............... 365/205, 207, 154, 189.05, 189.07
See application file for complete search history.

(56) References Cited

U.S. PATENT DOCUMENTS

| | | | |
|---|---|---|---|
| 6,449,195 | B1 | 9/2002 | Min et al. |
| 7,498,850 | B2 | 3/2009 | Hendrickson |
| 8,139,423 | B2 | 3/2012 | Kang |
| 8,456,197 | B2 | 6/2013 | Dubey et al. |
| 9,418,714 | B2 | 8/2016 | Sinangil et al. |

(Continued)

FOREIGN PATENT DOCUMENTS

EP 0 237 337 B1 1/1997

*Primary Examiner* — Connie C Yoha
(74) *Attorney, Agent, or Firm* — Birch, Stewart, Kolasch & Birch, LLP

(57) ABSTRACT

A method provided herein is adapted to a sense amplifier having a first cross-coupled latch and a second cross-coupled latch, each of which includes a first pair of transistors and a pair of coupling capacitors coupled to respective gate terminals of the first pair of transistors. The method includes, during a first phase, charging the pair of coupling capacitors of a first pair of transistors at a first cross-coupled latch to achieve zeroing and providing a first set of input voltages to a second cross-coupled latch, and, during a second phase following the first phase, discharging the pair of coupling capacitors to cancel a mismatch between the first pair of transistors and comparing the first set of input voltages provided to the second cross-coupled latch to generate a first set of output voltages.

19 Claims, 6 Drawing Sheets

(56) References Cited

U.S. PATENT DOCUMENTS

| | | | |
|---|---|---|---|
| 9,691,462 B2* | 6/2017 | Jung | ................. G11C 7/12 |
| 10,305,461 B2 | 5/2019 | Kushnarenko et al. | |
| 2016/0336933 A1* | 11/2016 | Krishna | ............ H03K 5/2481 |
| 2018/0083608 A1* | 3/2018 | Cho | ................. H03K 5/2481 |
| 2019/0089522 A1 | 3/2019 | Chattopadhyay et al. | |

* cited by examiner

OFFSET CANCELLATION VOLTAGE LATCH SENSE AMPLIFIER FOR NON-VOLATILE MEMORY

CROSS REFERENCE TO RELATED APPLICATIONS

This application claims the benefit of U.S. Provisional Application No. 62/886,286, filed on Aug. 13, 2019, the entirety of which is incorporated by reference herein.

BACKGROUND OF THE INVENTION

Field of the Invention

The disclosure relates generally to a sense amplifier for non-volatile memory and more particularly it relates to an offset cancellation sense amplifier, which overcomes non-idealities of process variations and allows it to be operated at higher speeds.

Description of the Related Art

Sense amplifiers are widely known in the art and are commonly employed in many types of integrated circuits such as random access semiconductor memory devices containing a plurality of rows and columns of memory cells to detect and amplify the signals that are generated by the memory cells.

To access a particular group of memory cells, i.e. a word, located within a memory array, the addresses of both the row and the columns to which the memory cell group is coupled must first be decoded. For example in a Static Random Access Memory (SRAM) array, each cell in the array is connected to two "bit lines", one the complement of the other. These two bit lines, known as the "true" and "complement" bit lines, together comprise a column, the address of which must be decoded in order to read or write the state of any one cell connected to the column.

However, mismatch of the input stage of a latch-type sense amplifier determines sensitivity and the minimum voltage differential that can be sensed. Therefore, it is required to minimize mismatch of a latch-type sense amplifier to improve the performance of a latch-type sense amplifier.

BRIEF SUMMARY OF THE INVENTION

A sense amplifier for non-volatile memory is provided herein. The sense amplifier includes a plurality of cross-coupled latches, which alternatively operate in a zeroing state and a sensing state in parallel. Therefore, the time for the cross-coupled latches operating in zeroing state can be viewed as zero, so that the speed for sensing data can be much faster.

In an embodiment, a method adapted to a sense amplifier having a first cross-coupled latch and a second cross-coupled latch is provided herein. Each of the first cross-coupled latch and the second cross-coupled latch comprises a first pair of transistors and a pair of coupling capacitors coupled to respective gate terminals of the first pair of transistors. The method comprises: during a first phase, charging the pair of coupling capacitors of a first pair of transistors at a first cross-coupled latch to achieve zeroing, and providing a first set of input voltages to a second cross-coupled latch; and during a second phase following the first phase, discharging the pair of coupling capacitors to cancel a mismatch between the first pair of transistors, and comparing the first set of input voltages provided to the second cross-coupled latch to generate a first set of output voltages.

In an embodiment, a sense amplifier comprises a first cross-coupled latch, a second cross-coupled latch, a set of input switches, and a set of output switches. The first cross-coupled latch operates in a charging state and a discharging state. The second cross-coupled latch operates in a sampling state in response to the first cross-coupled latch operating in the charging state and operates in a comparing state in response to the first cross-coupled latch operating in the discharging state. The set of input switches provides a set of input voltages to the second cross-coupled latch in response to the second cross-coupled latch operating in the sampling state and the comparing state. The set of output switches is coupled to the second cross-coupled latch in response to the second cross-coupled latch operating in the comparing state.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
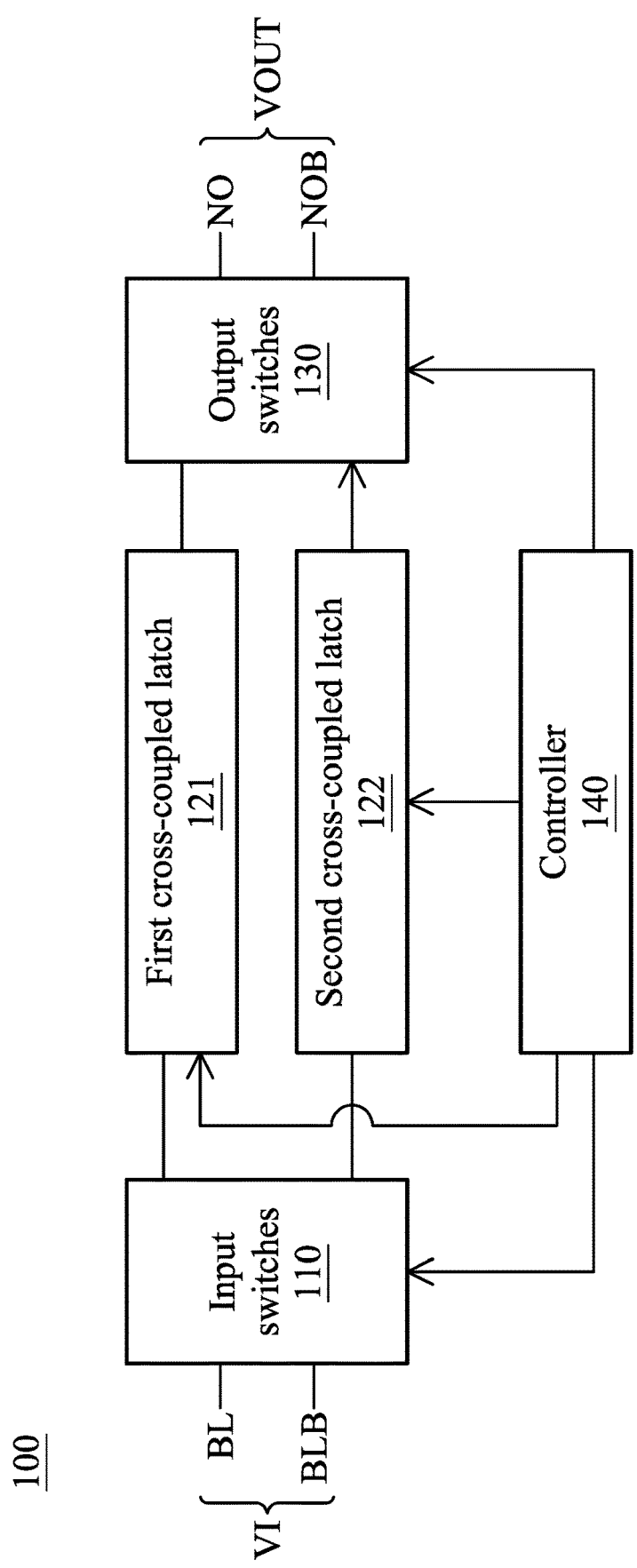
FIG. 1 is a block diagram of a sense amplifier in accordance with an embodiment of the invention.

FIG. 1 is a block diagram of a sense amplifier in accordance with an embodiment of the invention. As shown in FIG. 1, the sense amplifier 100 includes a set of input switches 110, a first cross-coupled latch 121, a second cross-coupled latch 122, a set of output switches 130, and a controller 140. According to an embodiment of the invention, the first cross-coupled latch 121 and the second cross-coupled latch 122 have the identical circuit structure.

The input switches 110 are configured to provide a set of input voltages VI from a bit line BL and a complement bit line BLB to the first cross-coupled latch 121 or the second cross-coupled latch 122. The first cross-coupled latch 121 or the second cross-coupled latch 122 senses the provided input voltages VI to generate a set of output voltages VOUT. The output switches 130 provide the output voltages VOUT from the first cross-coupled latch 121 or the second cross-coupled latch 122 to the output node NO and the complement output node NOB.

The controller 140 controls the input switches 110 to provide the input voltages VI to the first cross-coupled latch 121 or the second cross-coupled latch 122, and controls the output switches 130 to output the output voltages VOUT generated by the first cross-coupled latch 121 or the second cross-coupled latch 122. In addition, the controller 140 further controls the first cross-coupled latch 121 and the second cross-coupled latch 122 to sequentially and repeatedly operate in a charging state, a discharging state, a sampling state, and a comparing state. When the first cross-coupled latch 121 operates in the charging state and the discharging stage, the second cross-coupled latch 122 operates in the sampling state and the comparing state respectively, and vice versa.

For the sake of simplicity of explanation, only the operations of the input switches 110, the first cross-coupled latch 121, the second cross-coupled latch 122, and the output switches 130 will be fully discussed in the following paragraphs. According to other embodiments of the invention, the sense amplifier 100 may include a plurality of cross-coupled latches, and only two cross-coupled latches are illustrated herein.

Figure 2:
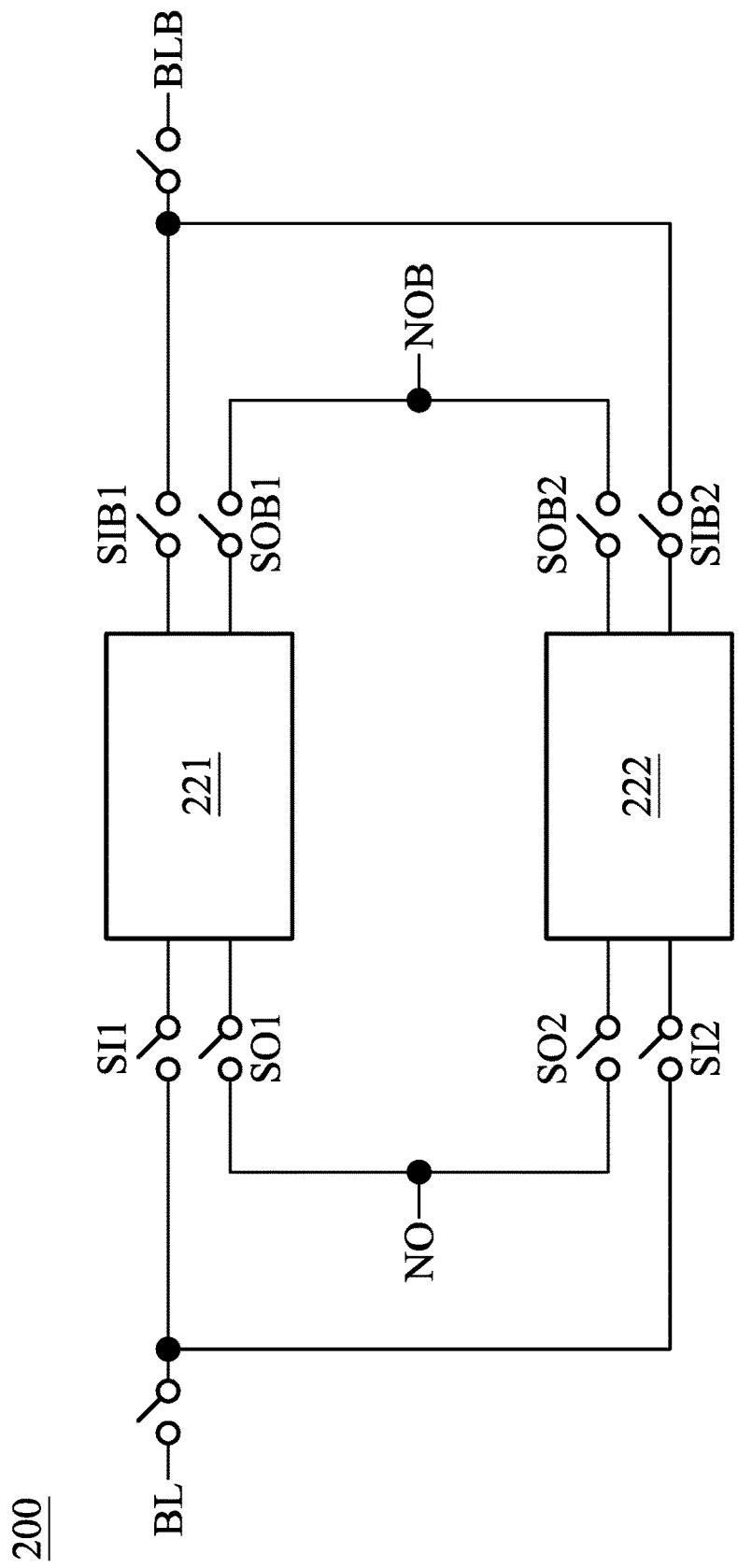
FIG. 2 is a schematic diagram of a sense amplifier in accordance with an embodiment of the invention.

FIG. 2 is a schematic diagram of a sense amplifier in accordance with an embodiment of the invention. As shown in FIG. 2, the sense amplifier 200 includes a first input switch SI1, a first complement input switch SIB1, a second input switch SI2, a second complement input switch SIB2, a first cross-coupled latch 221, a second cross-coupled latch 222, a first output switch SO1, a first complement output switch SOB1, a second output switch SO2, and a second complement output switch SOB2.

Comparing the sense amplifier 200 with the sense amplifier 100 in FIG. 1, the input switch SI1, the first complement input switch SIB1, the second input switch SI2, and the second complement input switch SIB2 correspond to the input switches 110 in FIG. 1, the first output switch SO1, the first complement input switch SOB1, the second output switch SO2, and the second complement output switch SOB2 correspond to the output switches 130 in FIG. 1, the first cross-coupled latch 221 corresponds to the first cross-coupled latch 121, and the second cross-coupled latch 222 corresponds to the second cross-coupled latch 122.

Figure 3:
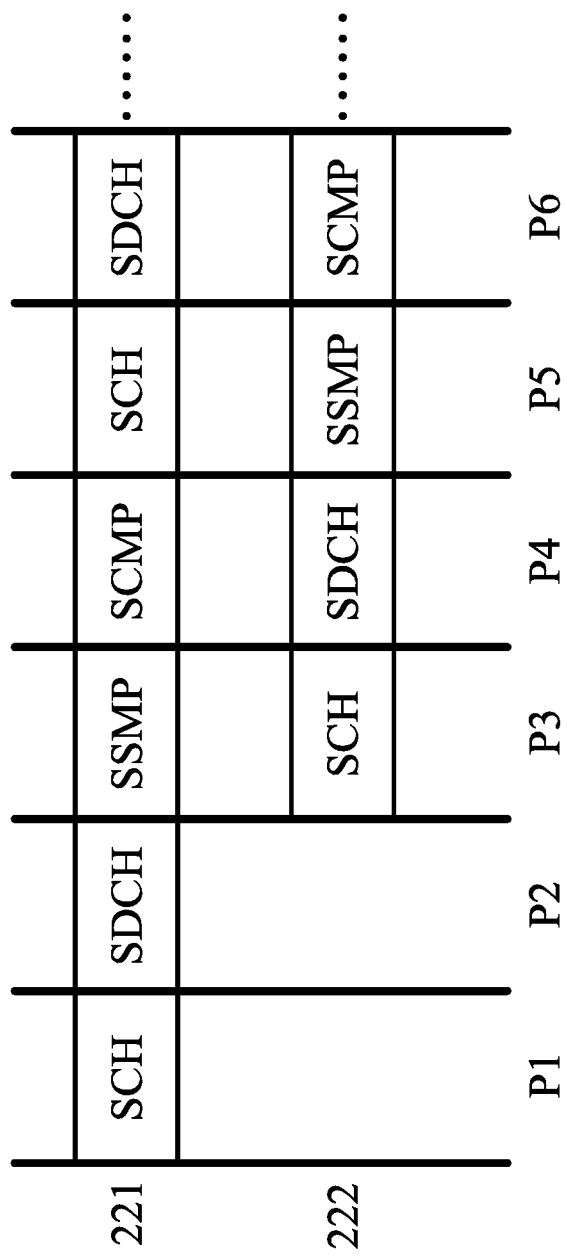
FIG. 3 shows a timing diagram of the sense amplifier in accordance with an embodiment of the invention.

FIG. 3 shows a timing diagram of the sense amplifier in accordance with an embodiment of the invention. As shown in FIG. 3, the first phase P1, the second phase P2, the third phase P3, the fourth phase P4, the fifth phase P5, and the sixth phase P6 are one after another. The first cross-coupled latch 221 and the second cross-coupled latch 222 sequentially and repeatedly operate in a charging state SCH, a discharging state SDCH, a sampling state SSMP, and a comparing state SCMP, in which the first cross-coupled latch 221 and the second cross-coupled latch 222 operate in parallel.

According to an embodiment of the invention, as shown in FIG. 3, when the first cross-coupled latch 221 operates in the sampling state SSMP during the third phase P3, the second cross-coupled latch 222 operates in the charging state SCH. According to another embodiment of the invention, when the first cross-coupled latch 221 operates in the comparing state SCMP during the fourth phase P4, the second cross-coupled latch 222 operates in the discharging state SDCH. During the fifth phase P5 and the sixth phase P6, the first cross-coupled latch 221 operates in the charging state SCH and the discharging state SDCH, and the second cross-coupled latch 222 operates in the sampling state SSMP and the comparing state SCMP.

In the charging state SCH and the discharging state SDCH, the first cross-coupled latch 221 or the second cross-coupled latch 222 is operated to zero the mismatch of the first cross-coupled latch 221 or the second cross-coupled latch 222. In the sampling state SSMP and the comparing state SCMP, the first cross-coupled latch 221 or the second cross-coupled latch 222 is operated to compare the input voltages VI from the bit line BL and the complement bit line BLB to generate the output voltages VOUT at the output node NO and the complement output node NOB.

According to an embodiment of the invention, the charging state SCH and the discharging state SDCH is a zeroing state. According to an embodiment of the invention, the sampling state SSMP and the comparing state SCMP is a sensing state. According to an embodiment of the invention, when one of the first cross-coupled latch 221 and the second cross-coupled latch 222 operates in the zeroing state for zeroing the mismatch, the other operates in the sensing state for sensing the input voltages VI from the bit line BL and the complement bit line BLB. Since one of the first cross-coupled latch 221 and the second cross-coupled latch 222 operates in the zeroing state during the other operates in the sensing state, the sense amplifier 200 can continuously sense the input voltages VI from the bit line BL and the complement bit line BLB without taking a period of time for zeroing.

According to an embodiment of the invention, the sense amplifier 200 in FIG. 2 is utilized in a non-volatile memory. The first cross-coupled latch 221 may operate in the charging state SCH (corresponding to first phase P1) and the discharging state SDCH (corresponding to the second phase P2) during the initialization of the non-volatile memory. Therefore, once the non-volatile memory is initialized, the first cross-coupled latch 221 is ready to sample, and to compare, the input voltages VI from the bit lint BL and the complement bit line BLB so that the speed of the sense amplifier 200 can be faster.

Figure 4:
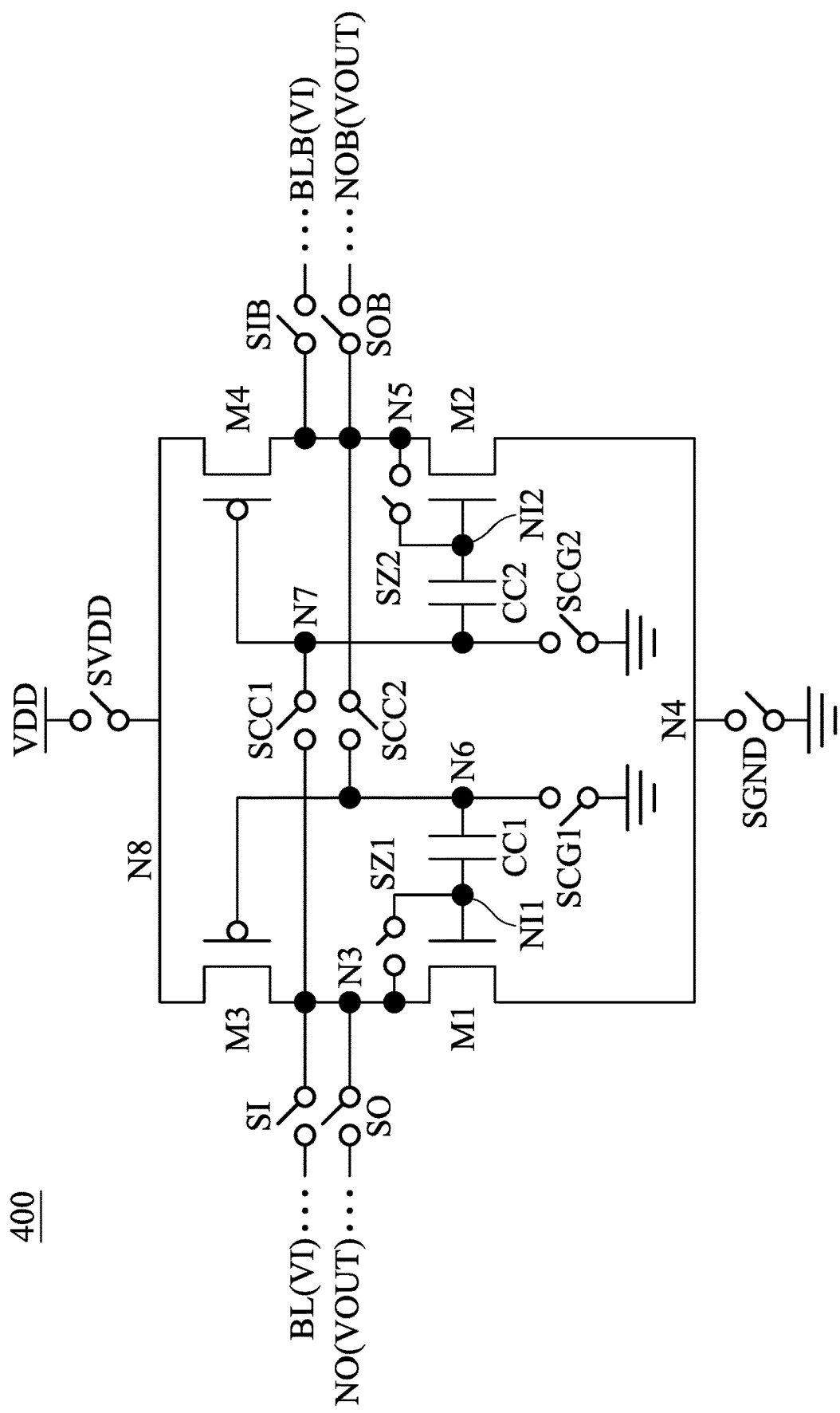
FIG. 4 is a schematic diagram of a cross-coupled latch in accordance with an embodiment of the invention.

FIG. 4 is a schematic diagram of a cross-coupled latch in accordance with an embodiment of the invention. As shown in FIG. 4, the cross-coupled latch 400 is an embodiment of the first cross-coupled latch 221 and the second cross-coupled latch 222 in FIG. 2. The input switch SI and the complement input switch SIB in FIG. 4 correspond to the first input switch SI1 and the first complement input switch SIB1, or the second input switch SI2 and the second complement input switch SIB2 in FIG. 2, respectively. The output switch SO and the output complement output switch SOB in FIG. 4 correspond to the first output switch SO1 and the first complement output switch SOB1, or the second output switch SO2 and the second complement output switch SOB2 in FIG. 2, respectively.

As shown in FIG. 4, the cross-coupled latch 400 includes a first transistor M1, a second transistor M2, a first coupling capacitor CC1, a second coupling capacitor CC2, a third transistor M3, and a fourth transistor M4. The first transistor M1, the second transistor M2, the third transistor M3, and the fourth transistor M4 form a cross-coupled latch, and the first coupling capacitor CC1 and the second coupling capacitor CC2 are configured to store the threshold voltages of the first transistor M1 and the second transistor M2 respectively.

The first transistor M1 includes a gate terminal, a drain terminal, and a source terminal, in which the gate terminal is coupled to a first internal node NI1, the drain terminal is coupled to a third node N3, and the source terminal is coupled to a fourth node N4. The second transistor M2 includes a gate terminal, a drain terminal, and a source terminal, in which the gate terminal is coupled to a second internal node NI2, the drain terminal is coupled to a fifth terminal N5, and the source terminal is coupled to the fourth node N4.

The first coupling capacitor CC1 is coupled between the first internal node NI1 and a sixth node N6. The second coupling capacitor CC2 is coupled between the second internal node NI2 and a seventh node N7.

The third transistor M3 includes a gate terminal, a drain terminal, and a source terminal, in which the gate terminal is coupled to the sixth node N6, the drain terminal is coupled to the third node N3, and the source terminal is coupled to an eighth node N8. The fourth transistor M4 includes a gate terminal, a drain terminal, and a source terminal, wherein the gate terminal is coupled to the seventh node N7, the drain terminal is coupled to the fifth node N5, and the source terminal is coupled to the eighth node N8.

The first cross-coupled latch 400 further includes a supply voltage switch SVDD, a grounding switch SGND, a first zeroing switch SZ1, a second zeroing switch SZ2, a first capacitor-grounding switch SCG1, a second capacitor-grounding switch SCG2, a first cross-coupled switch SCC1, and a second cross-coupled switch SCC2.

The supply voltage switch SVDD provides the supply voltage VDD to the eighth node N8. The grounding switch SGND is coupled between the fourth node N4 and a ground. The first zeroing switch SZ1 is coupled between the first internal node NI1 and the third node N3. The second zeroing switch SZ2 is coupled between the second internal node NI2 and the fifth node N5.

The first capacitor-grounding switch SCG1 is coupled between the sixth node N6 and the ground. The second capacitor-grounding switch SCG2 is coupled between the seventh node N7 and the ground. The first cross-coupled switch SCC1 is coupled between the third node N3 and the seventh node N7. The second cross-coupled switch SCC2 is coupled between the fifth node N5 and the sixth node N6.

When the cross-coupled latch 400 operates in the charging state SCH in FIG. 3, the first zeroing switch SZ1, the second zeroing switch SZ2, the first capacitor-grounding switch SCG1, the second capacitor-grounding switch SCG2, and the supply voltage switch SVDD are closed, the other switches are open. The supply voltage VDD charges the first coupling capacitor CC1 through the third transistor M3, the first zeroing switch SZ1, and the first capacitor-grounding switch SCG1, and charges the second coupling capacitor CC2 through the fourth transistor M4, the second zeroing switch SZ2, and the second capacitor-grounding switch SCG2.

When the cross-coupled latch 400 operates in the discharging state SDCH in FIG. 3, the supply voltage switch SVDD is turned OFF, the grounding switch SGND is turned ON, and the first zeroing switch SZ1, the second zeroing switch SZ2, the first capacitor-grounding switch SCG1, and the second capacitor-grounding switch SCG2 are still closed. The first coupling capacitor CC1 is discharged through the first zeroing switch SZ1 and the first transistor M1, and the second coupling capacitor CC2 is discharged through the second zeroing switch SZ2 and the second transistor M2. According to an embodiment of the invention, the mismatch of the cross-coupled latch 400 includes a mismatch in threshold voltages of the first transistor M1 and the second transistor M2.

In other words, the first coupling capacitor CC1 is discharged to the threshold voltage of the first transistor M1, and the second coupling CC2 is discharged to the threshold voltage of the second transistor M2. Namely, the first coupling capacitor CC1 and the second coupling capacitor CC2 respectively store the threshold voltages of the first transistor M1 and the second transistor M2 during the discharging state SDCH.

When the cross-coupled latch 400 operates in the sampling state SSMP in FIG. 3, the first zeroing switch SZ1, the second zeroing switch SZ2, the first capacitor-grounding switch SCG1, the second capacitor-grounding switch SCG2, and the grounding switch SGND are turned OFF, and the input switch SI, the complement input switch SIB, the first cross-coupled switch SCC1, and the second cross-coupled switch SCC2 are turned ON. Therefore, the input voltages VI are provided to the sixth node N6 and the seventh node N7 to turn ON/OFF the third transistor M3 and the fourth transistor M4, and the first transistor M1, the second transistor M2, the third transistor M3, and the fourth transistor M4 form a cross-coupled latch due to the first cross-coupled switch SCC1 and the second cross-coupled switch SCC2 turned ON.

When the cross-coupled latch 400 operates in the comparing state SCMP in FIG. 3, the output switch SO, the complement output switch SOB, the supply voltage SVDD, and the grounding switch SGND are turned ON. Therefore, the cross-coupled latch 400 compares the input voltages VI from the bit line BL and the complement bit line BLB, so as to generate the output voltages VOUT at the output node NO and the complement output node NOB.

For example, the bit line BL is in the low logic level, and the complement bit line BLB is in the high logic level. When the input voltages VI from the bit line BL and the complement bit line BLB are provided to the cross-coupled latch 400 in the sampling state SSMP, the third node N3 and the seventh node N7 are in the low logic level, and the fifth node N5 and the sixth node N6 are in the high logic level. Therefore, the first transistor M1 and the fourth transistor M4 are turned ON.

When the supply voltage switch SVDD and the grounding switch SGND are closed in the comparing state SCMP, the first transistor M1 pulls the voltage of the third node N3 down to the ground, and the fourth transistor M4 supplies the supply voltage VDD to the fifth node N5. Then, the voltages of the third node N3 and the fifth node N5 are output to the output node NO and the complement output node NOB respectively as the output voltages VOUT. The input voltages VI is therefore sensed by the cross-coupled latch 400.

Figure 5:
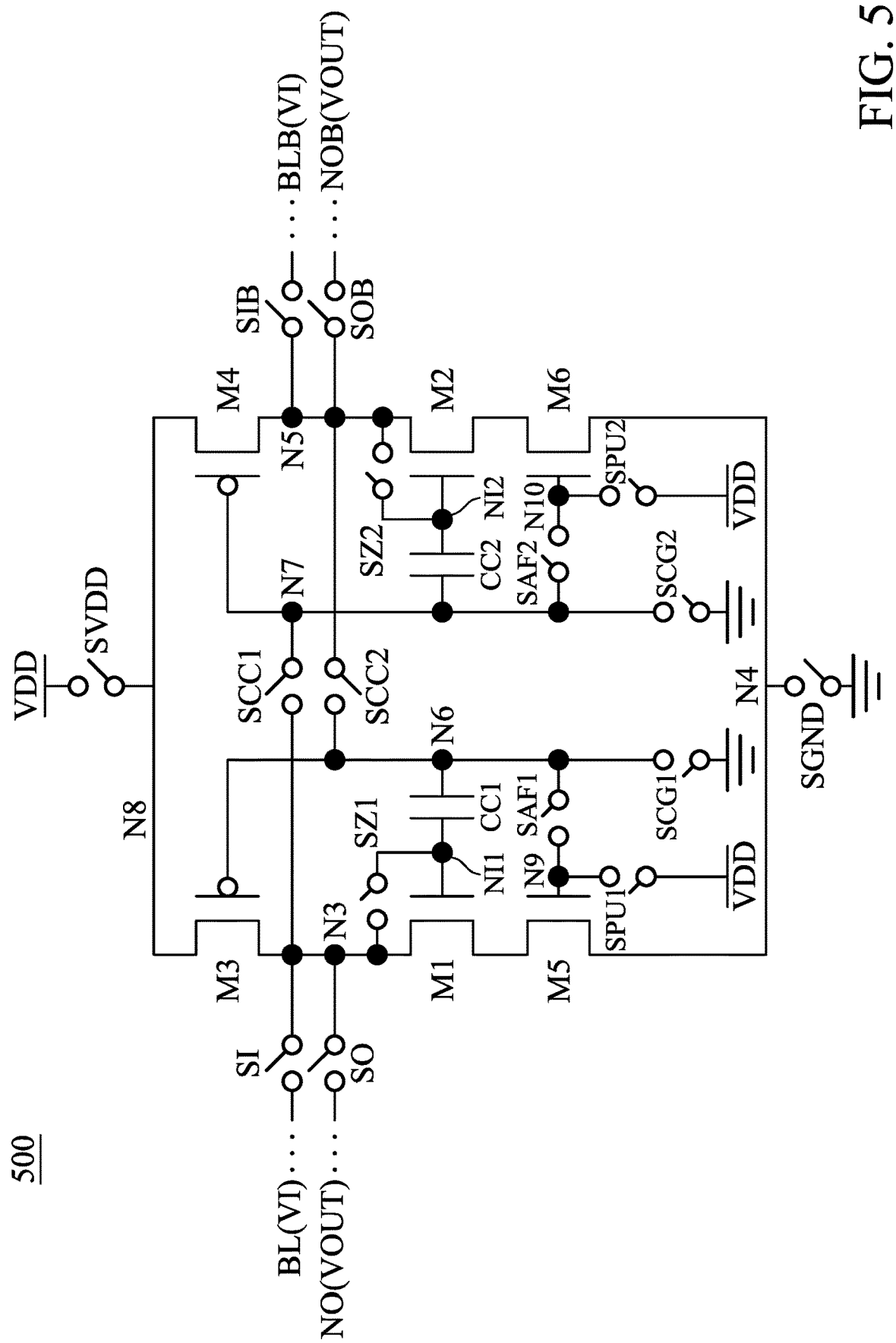
FIG. 5 is a schematic diagram of a cross-coupled latch in accordance with another embodiment of the invention.

FIG. 5 is a schematic diagram of a cross-coupled latch in accordance with another embodiment of the invention. According to an embodiment of the invention, the cross-coupled latch 500 in FIG. 5 corresponds to the first cross-coupled latch 221 and the second cross-coupled latch 222 in FIG. 2.

Comparing the cross-coupled latch 500 in FIG. 5 with the cross-coupled latch 400 in FIG. 4, the cross-coupled latch 500 further includes a fifth transistor M5 and a sixth transistor M6.

The fifth transistor M5 includes a gate terminal, a drain terminal, and a source terminal, wherein the gate terminal is coupled to a ninth node N9, the drain terminal is coupled to the source terminal of the first transistor M1, and the source terminal is coupled to the fourth node N4. The sixth transistor M6 includes a gate terminal, a drain terminal, and a source terminal, wherein the gate terminal is coupled to a tenth node N10, the drain terminal is coupled to the source terminal of the second transistor M2, and the source terminal is coupled to the fourth node N4.

The cross-coupled latch 500 further includes a first anti-floating switch SAF1, a second anti-floating switch SAF2, a first pull-up switch SPU1, and a second pull-up switch SPU2. The first anti-floating switch SAF1 is coupled between the sixth node N6 and the ninth node N9. The second anti-floating switch SAF2 is coupled between the seventh node N7 and the tenth node N10. The first pull-up switch SPU1 provides the supply voltage VDD to the ninth node N9. The second pull-up switch SPU2 provides the supply voltage VDD to the tenth node N10.

Since the cross-coupled latch 500 has the identical elements of the cross-coupled latch 400, the operations of those identical elements in the cross-coupled latch 500 operating in the charging state SCH, the discharging state SDCH, the sampling state SSMP, and the comparing state SCMP will not be repeated herein.

When the cross-coupled latch 500 operates in the charging state SCH, the discharging state SDCH, or the sampling state SSMP, the first pull-up switch SPU1 and the second pull-up switch SPU2 respectively provide the supply voltage VDD to the gate terminals of the fifth transistor M5 and the sixth transistor M6, so that the fifth transistor M5 and the sixth transistor M6 are fully turned ON.

When the cross-coupled latch 500 operates in the comparing state SCMP, the first anti-floating switch SAF1 couples the ninth node N9 to the sixth node N6 and the second anti-floating switch SAF2 couples the tenth node N10 to the seventh node N7, so as to prevent an instant leakage current flowing from the supply voltage VDD to the ground.

Referring to FIG. 4, for example, when the cross-coupled latch 400 operates in the comparing state SCMP and the voltage of the complement bit line BLB in low logic level is provided to the sixth node N6, the first transistor M1 is operated in the sub-threshold region due to the threshold voltage stored in the first coupling capacitor CC1. In addition, the third transistor M3 is turned ON due to the voltage of the sixth node N6 in the low logic level. Therefore, it may lead to an instant leakage current flowing from the supply voltage VDD to the ground, so as to increase the power consumption.

Referring to FIG. 5, when the ninth node N9 is coupled to the sixth node N6 in the comparing state SCMP, the fifth transistor M5 can be turned OFF due to the sixth node N6 in the low logic level, so as to eliminate the instant leakage current and to reduce the power consumption for low-power application.

Figure 6:
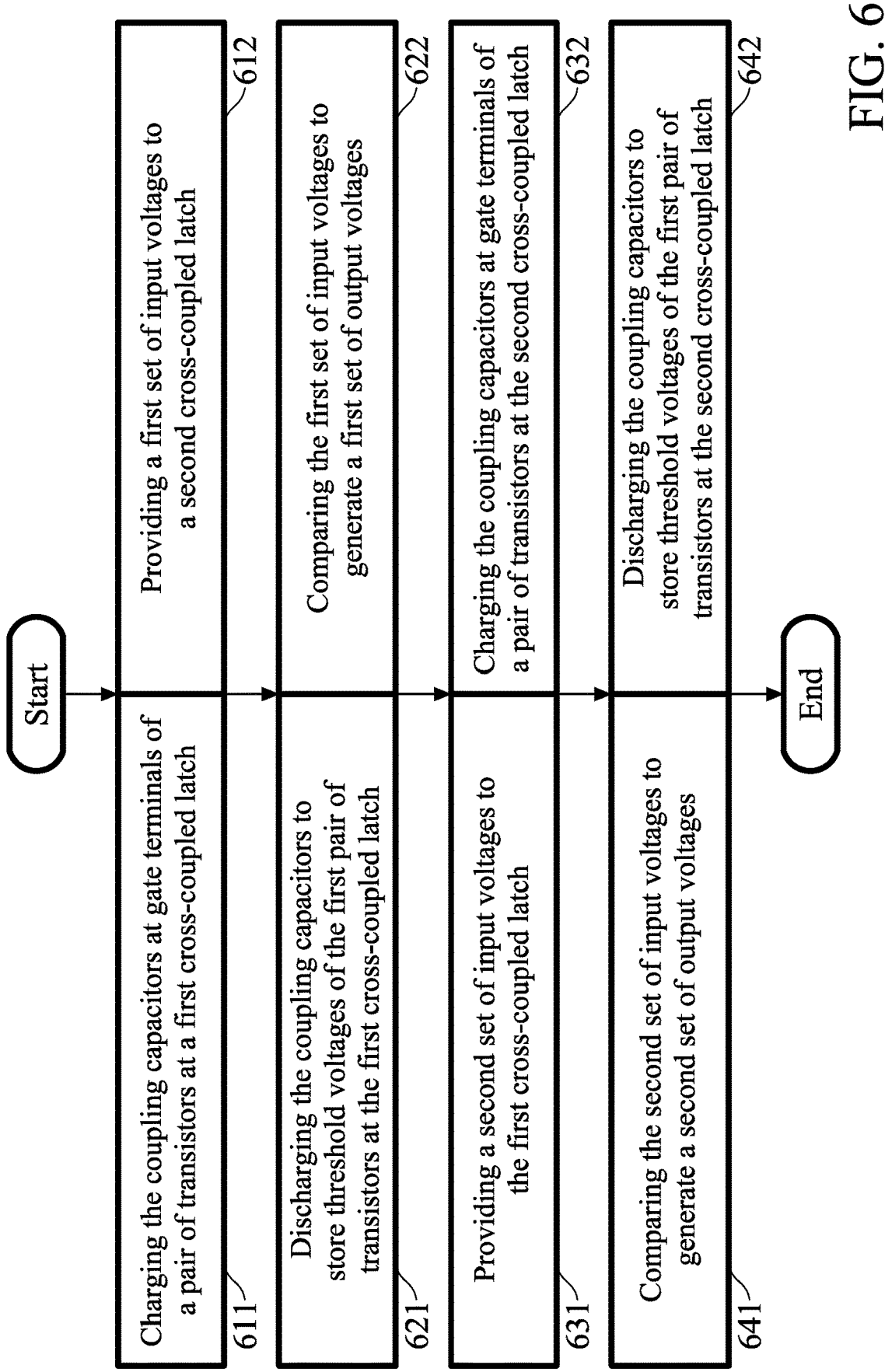
FIG. 6 is a flow chart of operations of a cross-coupled latch in accordance with the embodiment of the invention.

FIG. 6 is a flow chart of operations of a cross-coupled latch in accordance with the embodiment of the invention. As shown in FIG. 6, the blocks 611~641 are operated by the first cross-coupled latch 221 in FIG. 2, and the blocks 612~642 are operated by the second cross-coupled latch 222 in FIG. 2. According to an embodiment of the invention, each of the first cross-coupled latch 221 and the second cross-coupled latch 222 may be the cross-coupled latch 400 in FIG. 4. According to another embodiment of the invention, each of the first cross-coupled latch 221 and the second cross-coupled latch 222 may be the cross-coupled latch 500 in FIG. 5.

During a first phase, the first coupling capacitor CC1 and the second coupling capacitor CC2 at the first cross-coupled latch 221 are charged to achieve zeroing at block 611. Meanwhile, a set of input voltages VI is provided to the second cross-coupled latch 222 at block 612.

During a second phase following the first phase, the first coupling capacitor CC1 and the second coupling capacitor CC2 at the first cross-coupled latch 221 are discharged to cancel a mismatch between the first transistor M1 and the second transistor M2 at the first cross-coupled latch 221 at block 621. Meanwhile, the set of input voltages VI provided to the second cross-coupled latch 221 is compared to generate a first set of output voltages VOUT at block 622.

During a third phase following the second phase, another set of input voltages VI is provided to the third transistor M3, the fourth transistor M4, the first coupling capacitor CC1, and the second coupling capacitor CC2 at the first cross-coupled latch 221 at block 631. Meanwhile, the first coupling capacitor CC1 and the second coupling capacitor CC2 at the second cross-coupled latch 222 are charged to achieve zeroing at block 632.

During a fourth phase following the third phase, the set of input voltages VI provided to the first cross-coupled latch 221 is compared to generate another set of output voltages VOUT at block 641. Meanwhile, the first coupling capacitor CC1 and the second coupling capacitor CC2 at the second cross-coupled latch 222 are discharged to cancel a mismatch between the first transistor M1 and the second transistor M2 at the second cross-coupled latch 222 at block 642.

A sense amplifier for non-volatile memory is provided herein. The sense amplifier includes a plurality of cross-coupled latches, which alternatively operate in a zeroing state and a sensing state in parallel. Therefore, the time for the cross-coupled latches operating in zeroing state can be viewed as zero, so that the speed for sensing data can be much faster.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method adapted to a sense amplifier having a first cross-coupled latch and a second cross-coupled latch, wherein each of the first cross-coupled latch and the second cross-coupled latch comprises a first pair of transistors and a pair of coupling capacitors coupled to respective gate terminals of the first pair of transistors, wherein the method comprises:

during a first phase, charging the pair of coupling capacitors of a first pair of transistors at a first cross-coupled latch to achieve zeroing, and providing a first set of input voltages to a second cross-coupled latch; and during a second phase following the first phase, discharging the pair of coupling capacitors to cancel a mismatch between the first pair of transistors, and comparing the first set of input voltages provided to the second cross-coupled latch to generate a first set of output voltages, wherein the mismatch between the first pair of transistors comprises a mismatch in threshold voltages of the first pair of transistors.

2. The method of claim 1, wherein the first cross-coupled latch has an identical circuit structure of the second cross-coupled latch.

3. The method of claim 1, wherein each of the first cross-coupled latch and the second cross-coupled latch further comprises a pair of zeroing switches allowing an internal node between the pair of coupling capacitors and the first pair of transistors to be charged or discharged, a set of capacitor-grounding switches grounding another node of the pair of coupling capacitors other than the internal node to achieve zeroing, a supply voltage switch providing a supply voltage to the second pair of transistors, a pair of cross-coupled switches turning OFF the cross-coupling during the zeroing, and a pair of input switches receiving input voltages, wherein the first phase comprises closing the pair of zeroing switches, the set of capacitor-grounding switches, and the supply voltage switch at the first cross-coupled latch and the pair of cross-coupled switches and the pair of input switches at the second cross-coupled latch.

4. The method of claim 3, wherein each of the first cross-coupled latch and the second cross-coupled latch further comprises a grounding switch grounding the first pair of transistors and a pair of output switches generating output voltages, wherein the second phase comprises opening the supply voltage switch at the first cross-coupled latch, closing the grounding switch at the first cross-coupled latch and the supply voltage switch, the grounding switch, and the pair of output switches at the second cross-coupled latch.

5. The method of claim 4, wherein each of the first cross-coupled latch and the second cross-coupled latch further comprises a second pair of transistors cascaded with the first pair of transistors, further comprising:
  during a third phase following the second phase, providing a second set of input voltages to the second pair of transistors and the pair of coupling capacitors at the first cross-coupled latch, and charging a pair of coupling capacitors at the second cross-coupled latch to achieve zeroing; and
  during a fourth phase following the third phase, comparing the second set of input voltages provided to the first cross-coupled latch to generate a second set of output voltages, and discharging the pair of coupling capacitors at the second cross-coupled latch.

6. The method of claim 5, wherein each of the first cross-coupled latch and the second cross-coupled latch further comprises a third pair of transistors cascaded between the first pair of transistors and the ground, wherein the third phase further comprises providing the second set of input voltages to the third pair of transistors at the first cross-coupled latch to reduce leakage currents flowing through the first pair of transistors at the first cross-coupled latch, wherein the third pair of transistors are cascaded with the first pair of transistors.

7. The method of claim 6, wherein the third pair of transistors at the first cross-coupled latch is fully turned ON during the first phase, the second phase, and the fourth phase.

8. The method of claim 5, wherein the third phase comprises closing the pair of cross-coupled switches and a pair of input switches at the first cross-coupled latch and the pair of zeroing switches, the pair of capacitor-grounding switches, and the supply voltage switch at the second cross-coupled latch.

9. The method of claim 8, wherein the fourth phase comprises closing the grounding switch at the second cross-coupled latch and the supply voltage switch, the grounding switch, and the pair of output switches at the first cross-coupled latch, and opening the supply voltage switch at the second cross-coupled latch.

10. A sense amplifier, comprising:
  a first cross-coupled latch, operating in a charging state and a discharging state;
  a second cross-coupled latch, operating in a sampling state in response to the first cross-coupled latch operating in the charging state and operating in a comparing state in response to the first cross-coupled latch operating in the discharging state;
  a set of input switches, providing a set of input voltages to the second cross-coupled latch in response to the second cross-coupled latch operating in the sampling state and the comparing state; and
  a set of output switches, coupled to the second cross-coupled latch in response to the second cross-coupled latch operating in the comparing state;
  wherein the first cross-coupled latch and the second cross-coupled latch each comprises a first pair of transistors;
  wherein during the discharging state, the mismatch in threshold voltages between the first pair of transistors of the first cross-coupled latch is cancelled.

11. The sense amplifier of claim 10, wherein the first cross-coupled latch and the second cross-coupled latch each further comprises:
  a pair of coupling capacitors, each coupled to respective gate terminal of the first pair transistors at an internal node;
  a set of zeroing switches, allowing the internal node between the coupling capacitors and the first pair of transistors to be charged or discharged to cancel a mismatch of the first pair of transistors;
  a set of capacitor-grounding switches, grounding another node of the pair of coupling capacitors other than the internal node to achieve zeroing;
  a second pair of transistors, cascaded with the first pair of transistors;
  a set of cross-coupled switches, turning OFF the cross-coupling during the zeroing;
  a supply voltage switch, providing a supply voltage to the second pair of transistors; and
  a grounding switch, grounding the first pair of transistors.

12. The sense amplifier of claim 11, wherein when the first cross-coupled latch or the second cross-coupled latch operates in the charging state, the set of zeroing switches, the set of capacitor-grounding switches, and the supply voltage switch are closed so that the pair of coupling capacitors are charged to the supply voltage.

13. The sense amplifier of claim 12, wherein when the first cross-coupled latch or the second cross-coupled latch operates in the discharging state, the supply voltage switch is opened and the set of zeroing switches, the set of capacitor-grounding switches, and the grounding switch are closed so as to store threshold voltages of the first pair of transistors in the pair of coupling capacitors.

14. The sense amplifier of claim 13, wherein when the first cross-coupled latch or the second cross-coupled latch operates in the sampling state, the set of input switches provide the input voltages to the first cross-coupled latch or the second cross-coupled latch, the set of cross-coupled switches are closed, and the supply voltage switch and the grounding switch are opened.

15. The sense amplifier of claim 14, wherein when the first cross-coupled latch or the second cross-coupled latch operates in the comparing state, the first pair of transistors and the second pair of transistors compare the input voltages from the set of input switches to generate a set of output voltages and transmits the set of output voltages through the set of output switches, and the supply voltage switch, the grounding switch, and the set of output switches are closed.

16. The sense amplifier of claim 15, wherein each of the first cross-coupled latch and the second cross-coupled latch sequentially and repeatedly operates in the charging state, the discharging state, the sampling state, and the comparing state.

17. The sense amplifier of claim 16, wherein each of the first cross-coupled latch and the second cross-coupled latch further comprises:
   a third pair of transistors, cascaded between the first pair of transistors and the ground;
   a pair of anti-floating switches, coupling respective gate terminals of the third pair of transistors to the nodes of the pair of coupling capacitors other than the internal node; and
   a pair of pull-up switches, providing the supply voltage to the respective gate terminals of the third pair of transistors.

18. The sense amplifier of claim 17, wherein when the first cross-coupled latch or the second cross-coupled latch operates in the charging state, the discharging state, or the sampling state, the respective gate terminals of the third pair of transistors are coupled to the supply voltage.

19. The sense amplifier of claim 18, wherein when the first cross-coupled latch or the second cross-coupled latch operates in the comparing state, the respective gate terminals of the third pair of transistors are coupled to the node of the pair of coupling capacitors other than the internal node.

\* \* \* \* \*